United States Patent [19]

Lehner et al.

[11] 4,012,765
[45] Mar. 15, 1977

[54] LEAD FRAME FOR PLASTIC ENCAPSULATED SEMICONDUCTOR ASSEMBLIES

[75] Inventors: Leo L. Lehner, Scottsdale; Eugene E. Segerson, Tempe, both of Ariz.

[73] Assignee: Motorola, Inc., Chicago, Ill.

[22] Filed: Sept. 24, 1975

[21] Appl. No.: 616,456

[52] U.S. Cl. .............................. 357/70; 357/72; 357/81; 29/589; 29/590; 29/591
[51] Int. Cl.[2] .................. H01L 23/48; H01L 29/44; H01L 29/52; H01L 29/60
[58] Field of Search ........... 357/70, 72, 81; 29/589, 29/590, 591

[56] References Cited

UNITED STATES PATENTS

| | | | |
|---|---|---|---|
| 3,574,815 | 4/1971 | Segerson | 357/70 |
| 3,581,387 | 6/1971 | Buck et al. | 357/70 |
| 3,698,074 | 10/1972 | Helda et al. | 357/70 |
| 3,736,367 | 5/1973 | Heinlen et al. | 357/70 |
| 3,829,598 | 8/1974 | Darnell | 357/81 |
| 3,902,189 | 8/1975 | Simpson | 357/70 |
| 3,922,712 | 11/1975 | Stryker | 357/70 |

*Primary Examiner*—Andrew J. James
*Attorney, Agent, or Firm*—Robert A. Farley

[57] ABSTRACT

An improved lead frame is provided for the manufacture of high heat dissipating semiconductor devices having a large heat sink metallic portion exposed with plastic encapsulating material partially disposed thereabout. A semiconductor unit is mounted directly on the heat sink such that high heat dissipation is obtained. The lead frame provides for pairs of metallic heat sink portions joined to a interdigitated center lead frame portion such that the interdigitation of the semiconductor device leads associated with each of the opposed heat sink portions provides for a high density lead frame structure from which a minimum of material must be removed in the fabrication process. The center lead frame portion comprises two parallel interconnecting rails or tie bars which provide a dual function in that they provide a mold stop for subsequent plastic encapsulation fabrication steps while simultaneously providing a support for alignment hole means which provide indexing of the lead frame and associated opposed heat sink portions through various automated manufacturing steps. The use of a composite lead frame structure wherein the metallic heat sink portion is joined to the center lead frame structure allows great versatility in the types of material and the types of fabrication steps used to provide a semiconductor device thus allowing manufacture at greatly reduced cost.

3 Claims, 8 Drawing Figures

LEAD FRAME FOR PLASTIC ENCAPSULATED SEMICONDUCTOR ASSEMBLIES

BACKGROUND

This invention relates to lead frames for the manufacture of semiconductor devices encapsulated in a plastic material and more particularly to lead frame structures which can be manufactured with greater versatility and a reduced loss of material thereby significantly reducing the cost of manufacture.

The development of more highly automated techniques for the manufacture of semiconductor devices has resulted in the development of various types of lead frames by which the relatively small and fragile metallic device leads ultimately associated with a semiconductor device are formed as a multiple unit preassembled structure which is structured to maintain mechanical rigidity by the use of tie bars and which is adapted for automatic assembly techniques with index holes. These mutliple unit lead frames allow automatically indexed sequential operations and batch handling and result in reduced manufacturing costs. Initially these lead frame approaches were proposed for low power transistor structures which were relatively small as in Helda et al, U.S. Pat. No. 3,444,441. Later developments expanded these techniques to physically larger transistor structures having much higher power dissipation requirements as in Segerson, U.S. Pat. No. 3,574,815. When semiconductor structures having higher power dissipation requirements are manufactured, an additional constraint is introduced in that the portion of the lead frame structure used to provide physical support for the semiconductor device must now be adapted to not only physically hold the semiconductor device but to effectively conduct heat away from the semiconductor device to avoid the build-up of high temperatures within the semiconductor device junctions which tend to destroy the device or reduce its long term reliability. Typically the method employed to improve the heat dissipation characteristics of this portion of the semiconductor device lead frame is to make the device support portion physically larger or thicker and to use metallic material particularly adapted to improve heat conduction. Thus the optimum characteristic of the die support portion of the semiconductor device lead structure may not be optimum for providing the other requirements of the semiconductor device leads. One prior art method used to overcome this problem is to reduce the thickness of the lead portion of a semiconductor lead frame by machining or by stamping while retaining the original thickness for the portion of the lead frame used for semiconductor device support. The desire to simply assembly procedures and to reduce the cost of materials used in fabricating semiconductor device lead frames also indicates that many advantages would accrue from higher density semiconductor device lead frames.

SUMMARY

Accordingly it is an object of this invention to provide an improved semiconductor device lead frame in which semiconductor device leads are interdigitated in an opposed fashion to provide a more dense and economical preassembly structure.

It is a further object of this invention to provide an improved semiconductor device lead frame in which the heat sink portion of the semiconductor device is joined to a center lead frame structure in an opposed offset mirror image manner such that the device leads are interdigitated providing a more compact and economic structure.

Briefly described, the present invention is an improved semiconductor lead frame in which heat sink portions are joined to an interdigitated center lead frame portion in an opposed offset mirror image configuration allowing dissimilar materials and manufacturing preparation to be used in fabricating the center lead frame portion and the heat sink portion prior to joining, allowing reduced material cost due to the higher center lead frame structure and allowing increased productivity and reduced handling cost in the various automated procedures used to manufacture the finished semiconductor device because the duality introduced by the offset mirror image structure effectively doubles the number of semiconductor devices processed per indexing operation.

DETAILED DESCRIPTION OF THE INVENTION

The invention is embodied in a semiconductor device lead frame primarily used in the manufacture of semiconductor devices which are used as power units requiring substantial dissipation of internally generated heat. The semiconductor device is comprised of three adjacent but physically separated metallic members lying in substantially a single plane with at least one of the members terminating at one end in a mounting portion displaced from this original plane and substantially larger than the balance of the members. The mounting portion has a first and a second surface and includes an opening extending therethrough. A semiconductor die is positioned on the mounting portion at the first surface and is connected electrically to the metallic member by wires. A plastic encapsulation is disposed about the die, the connecting wires and the immediately adjacent parts of the metallic members. The encapsulation is formed so that a region of both the first and the second surface of the mounting portion is exposed. A hole in the mounting portion adapts the semiconductor device for receiving a bolt or other fastening to mount the device on a metal surface in electrical equipment.

Figure 1:
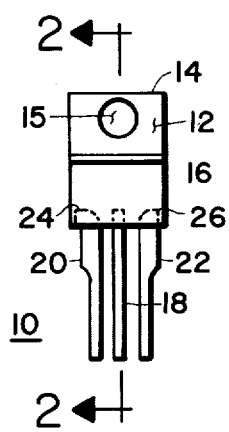
FIG. 1 is an enlarged plan view of the top face of a transistor device fabricated using the semiconductor device lead frame of the present invention.

FIG. 1 shows a semiconductor device 10 as viewed from the top such that the exposed part of the first surface 12 of the mounting portion 14 is visible. The remaining portion of the mounting surface is surrounded by plastic 16 which forms the encapsulation for the device. A semiconductor die (not visible in this view) is mounted directly on the upper surface 12 of the mounting portion 14 so that there is good heat transfer between the two although the die may be electrically insulated therefrom. When assembled in electrical equipment one or the other surface of the mounting portion is generally coupled with a large heat sink to provide for the rapid and efficient removal of heat generated internally during the operation of the semiconductor device.

Figure 2:
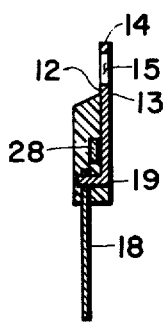
FIG. 2 is a view in section along line 2—2 of the device shown in FIG. 1.
Figure 8:
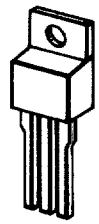
FIG. 8 is a perspective view in approximately actual size of one commerical embodiment of the invention.

As shown in the cross-sectional view of FIG. 2 the mounting portion 14 is integrally joined to a semiconductor device lead 18, the mounting portion 14 being formed with an offset bend 19 which allows the semiconductor device lead 18 to be disposed in a plane through the center of the plastic encapsulation. FIG. 2 also shows the second surface 13 of the mounting portion 14. Referring again to FIG. 1, two other semiconductor device leads 20 and 22 extend outwardly from plastic 16 substantially parallel to device lead 18. Leads 20 and 22 terminate in wire bonding pads 24 and 26 which are terminating sections of the semiconductor leads that have been enlarged to facilitate bonding thereto of the fine wires utilized in assembling the semiconductor device 10. Pads 24 and 26 are in close proximity to the mounting portion 12 and in the same plane as semiconductor device leads 20 and 22. These enlarged areas are enclosed in the plastic encapsulation 16 of the final semiconductor device.

Although device 10 has three leads, the invention is not to be construed as being limited to this number as it is evident that the number of leads may be readily increased. All these leads are fabricated from a metal having a very low electrical resistance and a very high thermal conductivity and preferably comprise a base metal of copper plated with nickel or silver for corrosion resistance and for facilitating the assembly operation.

Plastic 16 is preferrably a low-shrinkage, filled epoxy material suitable for transfer molding. In choosing a plastic, its compatibility with the components of the device and the stability of the device encapsulated therein when aged and subject to a wide variation in environmental conditions are two considerations of prime importance. A plastic suitable for transfer molding is preferred because the resulting encapsulation is uniform, void free, and tightly sealed about the elements of the device. Epoxy and silicone plastics, with or without fillers, are preferred although many other well known plastics with similar properties may be utilized.

In transfer molding the plastic encapsulation of semiconductor devices, heat and pressure are applied to convert the plastic which is normally in a solid state into a very low viscosity liquid which is then rapidly transferred from one mold chamber to another normally comprising the final package shape. Because of this low viscosity in the nature of the transfer molding, high pressures may be utilized without damaging the delicate parts associated with semiconductor devices. With the uniform mass formed by transfer molding the plastic encapsulation the elements of device 10 are held in a rigid fixed relationship and generally are not subject to damage by vibrations and shocks. The bottom surface 13 of mounting portion 14 (FIG. 2) is flush with the bottom surface of plastic 16 so that when mounted on a chassis or other structure, intimate contact is maintained therebetween. This provides a large heat transferring surface for dissipating heat vertically and laterally from a die 28 mounted on the first surface 12 of the mounting portion 14. The resulting effect is as if the die were mounted directly on the larger heat sink giving nearly ideal transferring properties.

Die 28 is a chip of silicon having two major faces wherein one face comprises the collector of a transistor and the other comprises the emitter and base. Although die 28 is fabricated from silicon, it can also be fabricated from other semiconductor materials.

The amount of heat that may be dissipated by a unit is effectively the amount that may be transferred across the boundary of one major face. The mounting of die 28 on the first surface 12 of mounting portion 14 as shown in FIG. 2 results in the direct flow of heat from one face of die 28, the collector in this transistor, through the mounting portion to, as is usually the situation, a larger heat sink. This short, direct path for the heat transfer takes full advantage of the maximum heat transferring area of the die.

Figure 3:
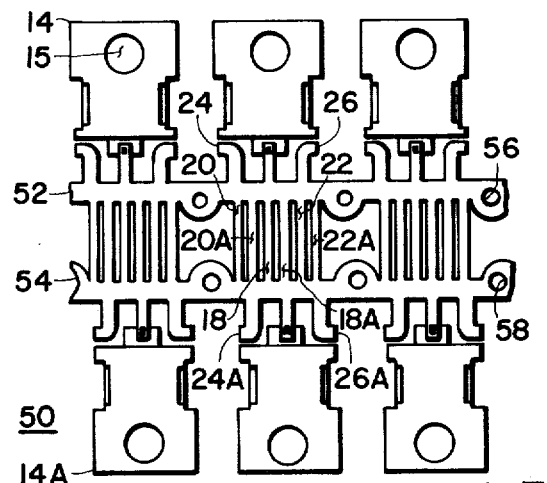
FIG. 3 is a plan view of the semiconductor lead frame of the present invention in which a continuous integral metallic strip is utilized for the automated assembly of a plurality of semiconductor devices that are cut apart after encapsulation to form the individual devices shown in FIG. 1.

Turning now to FIG. 3, there is shown a semiconductor device lead frame 50 according to the present invention which is particularly adapted to the efficient and low cost manufacture of the semiconductor device 10 previously described. The fabrication of semiconductor 10 is facilitated by use of the lead frame 50 which has been punched to form a plurality of interconnected groups of individual metallic members included in the final device. Each group includes mounting portion 14, wire bonding areas 24 and 26 and external leads 18, 20, 22. The unique arrangement of the lead frame 50 according to the present invention is to provide a second group of individual metallic members arranged such that the members of the group are disposed in an offset mirror image fashion with respect to the first group and with the individual external leads arranged in an interdigitated fashion to provide a final grouping which of high density and adapted to more efficient automated manufacturing steps. Thus, corresponding to mounting portion 14 is an opposed mounting portion 14A and imaged with the wirebonding areas 24 and 26 are the wire bonding areas 24A and 26A and correspondingly, imaged with the external leads 18, 20 and 22 are the external leads 18A, 20A, and 22A. The groups are joined by a pair of interconnecting strips or bands 52 and 54 each of which are provided with a plurality of openings 56 and 58 therein that are utilized to position the groups during the assembly sets as the strip is moved through an assembly machine.

Prior art semiconductor device lead frames such as those shown in Segerson, U.S. Pat. No 3,423,516 have shown pluralities of interconnected groups of individual metallic members interconnected by a connecting band provided with a plurality of openings. These prior art semiconductor lead frames comprised interconnected groups of individual metallic members but did not disclose the offset mirror image arrangement of pairs of groups in accordance with the present invention as herein previously described. Thus, in prior art systems, a separate tie strip was provided to retain the individual metallic members of a given group in a set relationship with respect to each other during the assembly steps. One of the particular advantages of the present invention is the fact that with an offset mirror image arrangement, the interconnecting strips 52 and 54, as shown in FIG. 3, have a dual function. First, they provide an interconnecting strip containing a plurality of indexing openings such as 56 and 58 of (FIG. 3) satisfying the requirement for positioning the groups during assembly steps. Second, they simultaneously provide the functional requirement of a tie strip which holds the individual metallic members of each group in rigid alignment during all assembly steps. Thus, the retention of a set alignment is maintained by the interconnecting strips 52 and 54 until after the individual devices corresponding to each group of individual metallic members have been encapsulated with a plastic layer which will subsequently hold all individual metallic members in correct alignment allowing the interconnecting strips to be sheared away and the leads to be electrically accessible. An additional function of the interconnecting strips 52 and 54 is that their outermost edges 21 and 21A (FIG. 4) provide a barrier or "stop" which limits the flow of plastic encapsulating material during the molding process.

Figure 4:
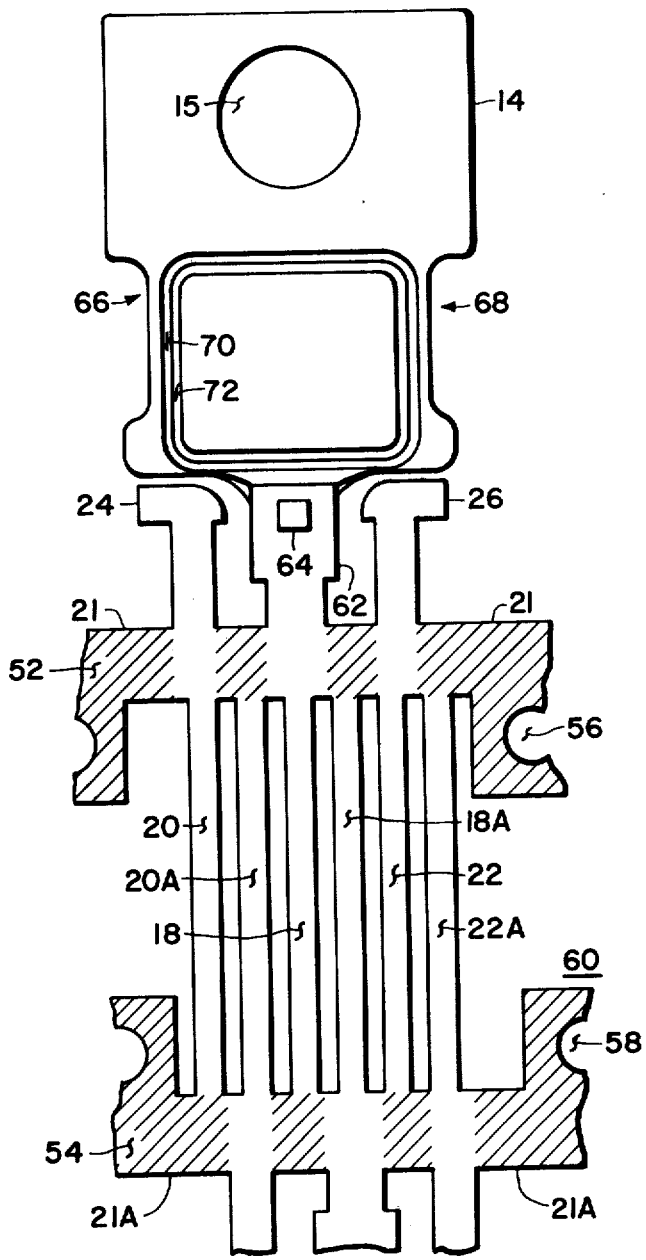
FIG. 4 is an enlarged plan view of a portion of the semiconductor device lead frame shown in FIG. 3.
Figure 5:
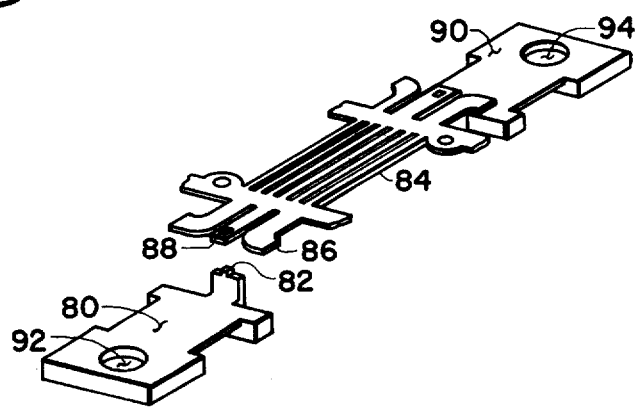
FIG. 5 is an enlarged isometric and exploded view of a portion of the semiconductor device lead frame shown in FIG. 3.

FIG. 4 shows an enlarged plan view of a portion 60 of the semiconductor devices lead frame 50 of FIG. 3. This enlarged view thus shows the center lead frame structure with the interdigitated device leads 20, 20A, 18, 18A, 22, and 22A held in rigid alignment by the interconnecting bands 52 and 54. Portions of the indexing holes 56 and 58 are also shown. Also, a part of the center lead frame structure is the wire bonding areas 24 and 26 which are located on either side of a joining region 62 which is adapted, in this particular embodiment, to provide a square shouldered socket which receives a similarly shaped tenon 64 which has been formed on the upward bent end of mounting portion 14. FIG. 4 also shows recessed grooves 70 and 72 which are formed in the first upper surface of mounting portion 14. These grooves provide a moisture barrier for the semiconductor die which mounts within their periphery and is then encapsulated in plastic as is described in the fabrication sequence described below. FIG. 5 shows an exploded isometric view which further illustrates the formation of this joint in showing a mounting piece 80 having a square shouldered tenon 82 disposed below a portion of a center lead frame structure. 84 which includes a joining region 86 containing a square shouldered socket 88 adapted to receive the tenon 82. This isometric view also illustrates in a pictorial fashion the arrangement of the present invention wherein the mounting piece 80 and an opposed mounting piece 90 are joined to the center lead frame structure 84 in an opposed offset mirror image fashion which allows for the interdigitation of the metallic members which will ultimately form the device leads of the finished semiconductor device. This view also more clearly illustrates the manner in which the first surface of mounting portion 80 and mounting portion 90 is disposed below the plane of the center lead frame structure to provide the physical arrangement which allows the completed semiconductor device to be mounted to a heat sink member through mounting holes 92 or 94. The particular arrangement of the present invention in which the mounting portions 80 and 90 are fabricated as a separate structure and then subsequently joined to the center lead frame section 84 in an opposed manner offers many advantages. Prior art lead frames typically formed the mounting portion and the center lead frame portion from a single strip of starting material by punching out the lead structure and mounting portion outline and then, in a subsequent step, forming the offset required to establish the first upper surface of the mounting portion below the plane of the device leads. In applications for semiconductor devices of a higher power dissipation, the structure of the mounting portion must be adapted to provide a maximum heat dissipation capability. Typically, this created capability is provided in increasing the thickness of the mounting portion and by changing the material used to form the mounting portion to obtain a structure with improved heat dissipation characteristics. The application of these additional constraints on the mounting portion creates difficulties since the increased thickness is inappropriate for the lead structure of the center lead frame portion and selection of materials with appropriate dissipation characteristics for the mounting portion may be incompatible with the material selection required for good mechanical characteristics of the semiconductor device leads. In contrast, the composite structure of the present invention allows each of the requirements of the mounting portion and of the semiconductor device lead portion to be optimized in terms of the type of structure and type of material used. A further advantage to the composite structure is that the individual component parts of the composite structure can now be manufactured using fabrication procedures which are optimized to their particular requirements. Thus, for example, the center lead frame section 84 can be punched or stamped as a continuous strip comprising a plurality of groups of individual metallic members which will ultimately form the interdigitated device lead structure in the finished composite assembly. Similarly, the mounting portions can be fabricated individually using cold forming procedures particularly adapted to the thicker material required to provide a mounting portion with optimum heat dissipation characteristics. Also, associated manufacturing steps such as plating can be performed and a method optimized for the particular component part of the final composite structure. For example, barrel plating can be used on the mounting portions to provide a high quality plated surface adapted for the optimum die mount characteristics.

In addition to the advantages associated with reduced cost of materials and with the ability to choose materials optimized for the particular function performed by the component part of the semiconductor device lead frame, the structure of the present invention offers further advantages relating to the way in which mounting portions are joined to the center lead frame structure in an opposed relationship in which the center leads are interdigitated and the mounting portions appear as offset mirror images of each other about central axe perpendicular to the device leads. This arrangement of mounting portions in pairs allows much higher productivity in many of the automated fabrication steps associated with the manufacture of a finished semiconductor device using the lead frame of the present invention. Basically, this advantage derives from the fact that twice the number of partially fabricated semiconductor devices can be moved past a given work station with a given indexing operation. Thus, referring to FIG. 3 the indexing hole 56 located within interconnecting band 52 and the indexing hole 58 located within interconnecting band 54 are uniquely associated with the pair of mounting portions 14 and 14A and the associated interdigitated device leads so that these indexing holes will ultimately be associated with two finished semiconductor devices once all fabrication steps are complete. Prior art lead frames such as disclosed in the patents previously cited disclose only a single semiconductor device associated with each indexing position along the frame. Thus, the semiconductor device lead frame of the present invention effectively doubles the number of devices involved with each indexing or handling step and thus has the potential of reducing the cost of these operations to one half of previous costs.

Figure 6:
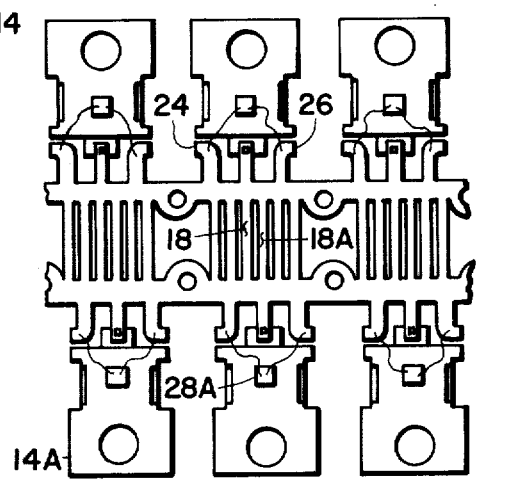
FIG. 6 is the semiconductor device lead frame shown in FIG. 3 with semiconductor devices affixed to mounting portions and joined by fine wires to integral lead portions of the semiconductor device lead frame.
Figure 7:
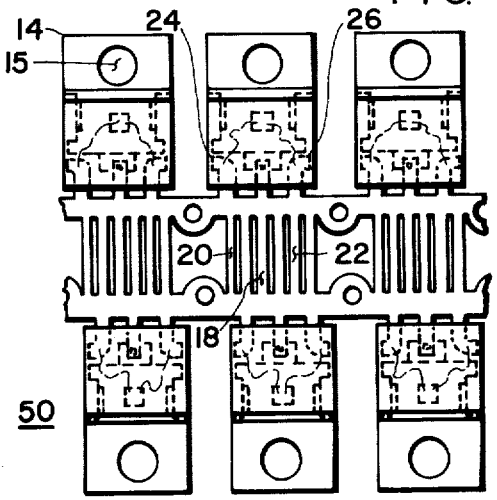
FIG. 7 is a transparent view of the semiconductor device lead frame of FIG. 6 after a plastic encapsulation has been disposed about the semiconductor device, the fine wires and an adjacent metallic portion of each device group such that the lead frame is ready to be sheared to produce individual devices as shown in FIG. 1.

FIG. 6 and FIG. 7 show the semiconductor device lead frame of the present invention at different points in the manufacturing sequence. To obtain the partially assembled configuration shown in FIG. 6, the lead frame 50 is inserted in a die bonder and the first pair of groups aligned with mounting portion 14 under a first die bonding needle and mounting portion 14A under a second die bonding needle. Once an initial alignment is made the remainder of the mounting portions 14 and 14A are automatically aligned under the needle in a progressive indexed operation. Die 28 is bonded in a preselected location on each mounting portion 14 and 14A towards the edge thereof near the interconnecting strip and on the center line of the mounting portion in alignment with center lead device 18 and 18A. Many techniques of die bonding are known and will not be described herein.

Lead frame 50 with die 28 bonded thereto corresponding in number to the groups of metallic members in the lead frame is transported as a unit to a wire bonding machine (not shown) and alignment is made on the first group and a fine wire 101 is bonded to die 28 and wire bonding area 24. The wire bonding is progressively repeated for each group on lead frame 50. At the completion of one pass of the strip through the wire bonder the first group is again positioned under the wire bonder and the operation repeated to bond a second fine wire 102 to die 28 and to wire bonding area 26. Fine wires 101 and 102 electrically couple the emitter and base electrodes of the transistor die 28 to their corresponding external leads. The ease and rapidity with which die 28 is mounted and the fine wires 101 and 102 are connected clearly evidence the efficient and inexpensive nature of this type of assembly. Lead frame 50 now including the partially assembled transistor devices removed from the wire bonder and transported to a transfer mold, (not shown) for plastic molding. The number of groups formed in a strip is usually selected so that the entire strip may be positioned in a transfer mold as a single unit and the mold closed thereabout to form individual mold cavities about each group of metallic members. Included in the cavity is mounting portion 14, die 28, fine wires 101, 102, wire bonding areas 24 and 24 and adjacent portions of leads 20, 18 and 22. The positioning of a group of metallic members within an individual mold cavity provides a clamping action across the first upper surface and the second lower surface of mounting portion 14 such that when the fluid plastic encapsulating material is forced into the mold cavity the flow of the plastic encapsulaing material is limited such that both the upper and lower surfaces of mounting portion 14 are free of plastic in the vicinity of the mounting hole 15.

With the mold closed, a fluid epoxy plastic material is transferred into the cavities to form individually encapsulated devices. The thermal setting epoxy plastic cures rapidly and a dense solid plastic encapsulation securely and tightly sealed about the protruding metallic members is formed. As shown in FIG. 7, a strip of interconnected completed devices has now been formed on the semiconductor device lead frame 50 with plastic encapsulation material 16 surrounding the inner part of mounting portion 14 including semiconductor die 28, wire bonding areas 24 and 26 and the ends of semiconductor device leads 18, 20 and 22. The transfer of the fluid epoxy material causes epoxy to flow into the inlet regions 66 and 68 present on each side of the mounting portion 14 (FIG. 4). As the plastic material shrinks during the curing cycle the epoxy is drawn into compression within these regions tightly locking the solid plastic material in place around the inner part of mounting portion 14 to guarantee a mechanically strong plastic package.

Semiconductor lead frame 50 is next transported to a metal shear where the cutting operation separates the plastic encapsulated groups to complete the fabrication of individual transistor device 10. The enlarged plan view of FIG. 4 shows as shaded areas the metal removed by the shearing device such that the interdigitated device leads 18, 18A, 20, 20A, 22 and 22A are cut apart to form the semiconductor device leads of two separated plastic encapsulated transistor structures. Once the devices have been cut apart they are catagorized according to their electrical characteristics to complete the fabrication steps.

The above description and drawings show that the present invention provides a novel semiconductor device lead frame which allows the fabrication of semiconductor devices encapsulated in a plastic material in an improved manner. The novel semiconductor device lead frame allows reduced material costs the selection of component materials that are optimized for the particular individual function provided and greatly reduced handling and assembly costs because the number of semiconductor devices processed in a given fabrication step is effectively doubled.

What is claimed is:

1. A lead frame for the assembly of semiconductor devices comprising:
   a. a first group of metallic members including a first die mount portion and semiconductor device leads;
   b. a first metallic interconnecting band attached to said device leads at a point in proximity to said first die mount portion, said attachments holding said device leads in a predetermined alignment;
   c. a second metallic interconnecting band attached to said device leads, said second interconnecting and spaced away from said first interconnecting band in a direction away from said first die mount portion;
   b. a second group of metallic members including a second die mount portion and semiconductor device leads wherein said second group of metallic members are attached to and held in alignment by said second interconnecting strip in the vicinity of said second die mount portion and further attached to and held in alignment by said first interconnnecting strip such that said device leads of said first group and said device leads of said second group are interdigitated.

2. A lead frame for the assembly of semiconductor devices as recited in claim 1 wherein said device leads and said first and said second interconnecting bands are fabricated by stamping from a continuous strip.

3. A lead frame for the assembly of semiconductor devices as recited in claim 2 wherein said die mount portion is fabricated as a separate structure and joined to one of said semiconductor device leads.

* * * * *